(12) United States Patent
Lu et al.

(10) Patent No.: US 11,112,638 B2
(45) Date of Patent: Sep. 7, 2021

(54) PANEL AND METHOD FOR MANUFACTURING PANEL WITH MINIMAL BORDER AREA

(71) Applicant: HON HAI PRECISION INDUSTRY CO., LTD., New Taipei (TW)

(72) Inventors: I-Min Lu, New Taipei (TW);
Chih-Fang Chen, Tu-Cheng (TW);
An-Chou Chen, New Taipei (TW);
Kuo-Sheng Lee, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 198 days.

(21) Appl. No.: 16/418,427

(22) Filed: May 21, 2019

(65) Prior Publication Data

US 2019/0361281 A1   Nov. 28, 2019

Related U.S. Application Data

(60) Provisional application No. 62/674,633, filed on May 22, 2018.

(51) Int. Cl.
| | |
|---|---|
| *G02F 1/1333* | (2006.01) |
| *G02F 1/1339* | (2006.01) |
| *G06F 3/041* | (2006.01) |
| *H01L 27/32* | (2006.01) |

(52) U.S. Cl.
CPC ........ *G02F 1/13338* (2013.01); *G02F 1/1339* (2013.01); *G06F 3/041* (2013.01); *H01L 27/323* (2013.01); *G02F 1/133357* (2021.01); *G06F 2203/04103* (2013.01)

(58) Field of Classification Search
CPC .............. G02F 1/13338; G02F 1/1339; G02F 1/133357; G06F 3/041; G06F 2203/04103; H01L 27/323; H05K 2201/05; H05K 2201/058
USPC .......................................................... 349/12
See application file for complete search history.

(56) References Cited

U.S. PATENT DOCUMENTS

| | | | |
|---|---|---|---|
| 2019/0206898 A1* | 7/2019 | Baek | H01L 27/124 |
| 2019/0250446 A1* | 8/2019 | Cheng | H05K 1/189 |

* cited by examiner

*Primary Examiner* — Nathanael R Briggs
*Assistant Examiner* — William D Peterson
(74) *Attorney, Agent, or Firm* — ScienBiziP, P.C.

(57) ABSTRACT

A touch and/or display panel with minimal border area includes a first substrate with first and second opposite surfaces. The panel further comprises a film on the first surface and bent to the second surface, the film is flexible and wires are patterned into the film. The film comprises first and second ends, the first end is located on the first surface, and the second end is located on the second surface and a chip is formed on the second end. A method for making the panel is also disclosed.

9 Claims, 14 Drawing Sheets

PANEL AND METHOD FOR MANUFACTURING PANEL WITH MINIMAL BORDER AREA

FIELD

The subject matter herein generally relates to display panels or touch panels.

BACKGROUND

Larger displays are preferred on electronic devices, borderless display screens are in demand. A conventional liquid crystal display comprises liquid crystal display panel that is composed of an upper glass substrate and a lower glass substrate, and generally the lower glass substrate is larger than the upper glass substrate. A driver chip can be fixed on a flexible circuit board by using Chip On Film (COF) technology, and the flexible circuit board to which the driver chip is fixed is bonded to the Outer Lead Bonding (OLB) area of the lower glass substrate through at least one bonding pad. The driver chip is on a side of the lower glass substrate away from its bonding surface. Since the flexible circuit board is bonded to the OLB area of the liquid crystal display device through the bonding pad, a large area in the OLB must be reserved, which is not conducive to the LCD becoming totally borderless.

Therefore, there is room for improvement in the art.

BRIEF DESCRIPTION OF THE DRAWINGS

Implementations of the present technology will now be described, by way of embodiments, with reference to the attached figures.

DETAILED DESCRIPTION

Figure 1:
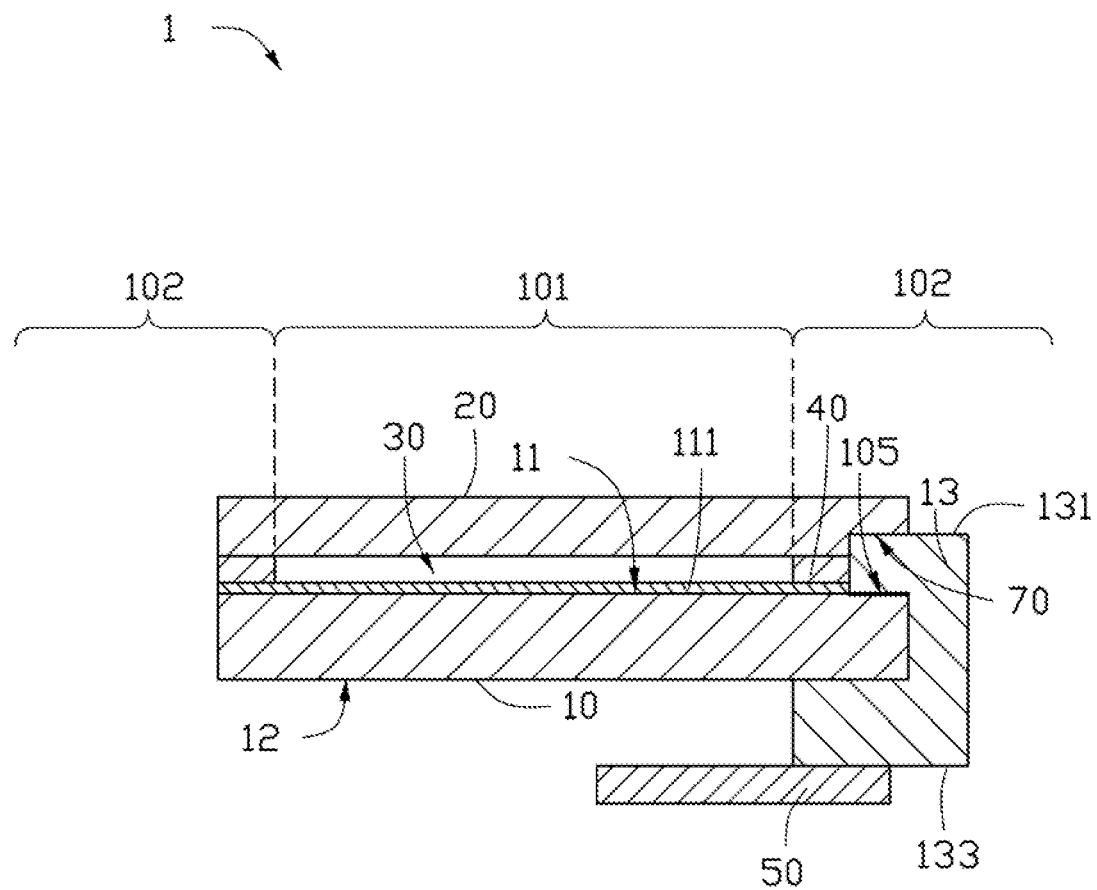
FIG. 1 is a cross-sectional view of an LCD panel according to a first embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as meaning connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

An electronic device according to an embodiment of the present disclosure includes at least one panel. It can be understood that the panel may be a touch panel and/or a display panel, for example, a liquid crystal display panel or an organic light emitting diode display panel. The panel further includes a film directly formed on an inner surface of a substrate of the panel and continuously extending to a bottom surface of the panel opposite to the inner surface. The film includes two ends, one of the ends is located on the bottom surface and formed with a bonding area for bonding a chip, the other one of the ends is located on the inner surface and electrically coupled to in-panel wires on the panel through conductive wires formed on the film.

A panel of the present disclosure will be described with reference to a liquid crystal display (LCD) panel as an example. Referring to FIG. 1, an LCD panel 1 includes a first substrate 10, a second substrate 20 and a liquid crystal layer 30 sealed between the first substrate 10 and the second substrate 20 by a sealant 40. The LCD panel 1 further includes a film 13 and a chip 50 configured on the film 13, the chip provides driving signals.

A functional layer 111 with a plurality of functional units achieving basic functions of the LCD panel 1 is formed on the first substrate. In this embodiment, the functional layer 111 is a thin film transistor (TFT) driving layer and the functional units are pixel units (not shown). The second substrate 20 is a color filter substrate having a plurality of filter units (not shown). In other embodiment, the first substrate 10 may be a color filter substrate, and the second substrate 20 may comprise a TFT driving layer.

The film 13 comprises a first end 131 and a second end 133 away from the first end 131. The first end 131 is directly formed on the first substrate 10 or the second substrate 20, and the second end 133 comprises a mounting area (not shown) for the bonding of other electronic components. In this embodiment, the chip 50 is bonded on the connecting area according COF. The second end 133 extends to a side of the first substrate 10 or the second substrate 20 away from the liquid crystal layer 30.

As shown in FIG. 1, the first substrate 10 comprises a first surface 11 and a second surface 12 opposite to the first surface 11. In this embodiment, the first end 131 is located on the first surface 11, and the first end 131 is directly in contact with the first surface 11. The second end 133 is bent to the second surface 12 and covers at least a portion of the second surface 12.

The first substrate 10 defines a functional area 101, a peripheral area 102 around the functional area 101, and a connecting area 105 located within the peripheral area 102. The pixel units of the TFT driving layer 111 used for display are all located within the functional area 101, and the sealant 40 is located in the periphery area 102. The connecting area 105 is closer to the outer edge of the first substrate 10 than to other portions of the peripheral area 102. The first end 131 is formed in the connecting area 105.

Light of the LCD panel 1 is emitted from the first substrate 10 to the second substrate 20. The chip 50 is overlapped with the first substrate 10 and the second substrate 20 along an emission direction of light, thereby the border of the LCD panel 1 may become narrower. Further, the chip 50 overlaps the first substrate 10, the second substrate 20, and the liquid crystal layer 30 along the emission direction.

The film is directly formed on the first substrate 10 without any bonding pad, therefore, the connecting area 105 does not need to form a plurality of bonding pads for bonding. A size of the connecting area can thus be reduced, which is advantageous to designing a narrower border.

The film 13 may be a flexible material such as polyimide (PI). The film 13 may be directly formed on the first substrate 10 by coating or other suitable methods. The film 13 does not need to be bonded by hot pressing through the bonding pads, which allows the film 13 to be thinner. In this embodiment, a thickness of the film 13 is less than or equal to 10 μm. In this embodiment, the thickness of the film 13 is greater than a thickness of the liquid crystal layer 30.

Figure 2:
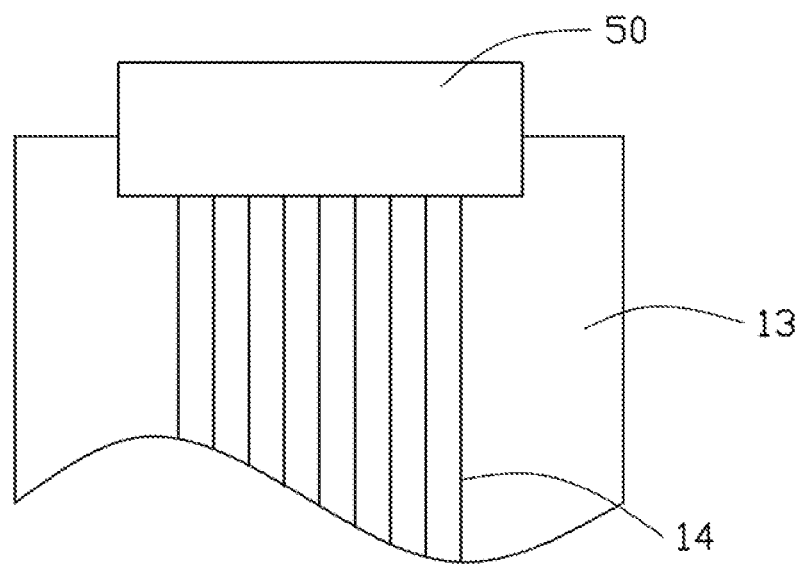
FIG. 2 is a planar view showing a chip fixed to a film by using COF according to an embodiment of the present disclosure.

Referring to FIG. 2, the chip 50 is fixed on the film 13 by using COF technology. A plurality of conductive wires 14 are formed on the film 13, the conductive wires 14 are used to electrically couple the chip 50 and a plurality of in-panel wires of the first substrate 10. The in-panel wires connect to the functional units and provide signal transmission paths between the driving signals and the functional units.

As shown in FIG. 1, in this embodiment, the first substrate 10 has a same area size as that of the second substrate 20, the film 13 is located between the first substrate 10 and the second substrate 20. Due to the thickness of the film 13 being greater than the thickness of the liquid crystal layer 30, in order to avoid increasing a distance between the first substrate 10 and the second substrate 20, a recess 70 may be formed on at least one of the first substrate 10 and the second substrate 20 to accommodate the film 13.

In this embodiment, the chip 50 may be a gate driver, a source driver, or a time controller.

Figure 3:
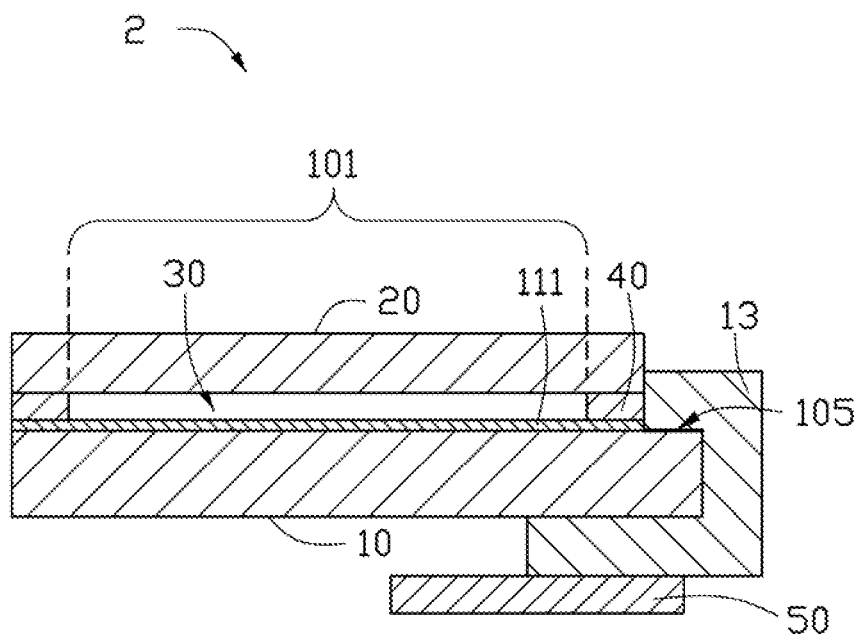
FIG. 3 is a cross-sectional view of an LCD panel according to a second embodiment of the present disclosure.

FIG. 3 shows an LCD panel 2 according to a second embodiment of the present disclosure. In this embodiment, the second substrate 20 has a same area size as remaining area of the first substrate 10 without the connecting area 105. The second substrate 20 does not overlap the connecting area 105 of the first substrate 10, neither does the second substrate 20 overlap a portion of the film 13 located on the connecting area 105. In this embodiment, when the thickness of the film 13 is greater than the thickness of the liquid crystal layer 30, there is no need to form the recess 70, which simplifies the manufacturing process. It can be understood that, in other embodiments, when the film 13 is directly formed on the second substrate 20, the first substrate 10 may not overlap the portion of the film 13 located on the connecting area.

Figure 4:
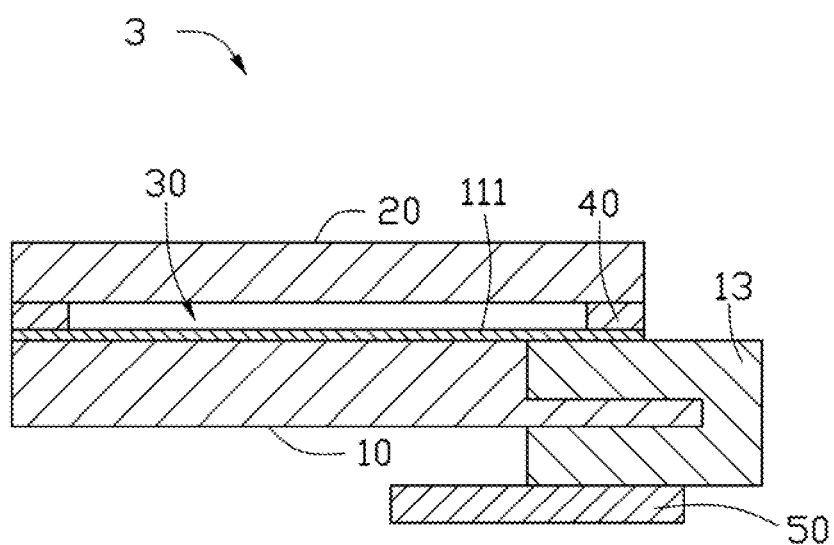
FIG. 4 is a cross-sectional view of an LCD panel according to a third embodiment of the present disclosure.

FIG. 4 shows an LCD panel 3 according to a third embodiment of the present disclosure. In this embodiment, the recess 70 is formed on the first substrate 10. A portion of the film 13 extending beyond the thickness of the sealant 40 may be accommodated in the recess 70, so that the film 13 will not increase the thickness of the liquid crystal layer 30.

Figure 5:
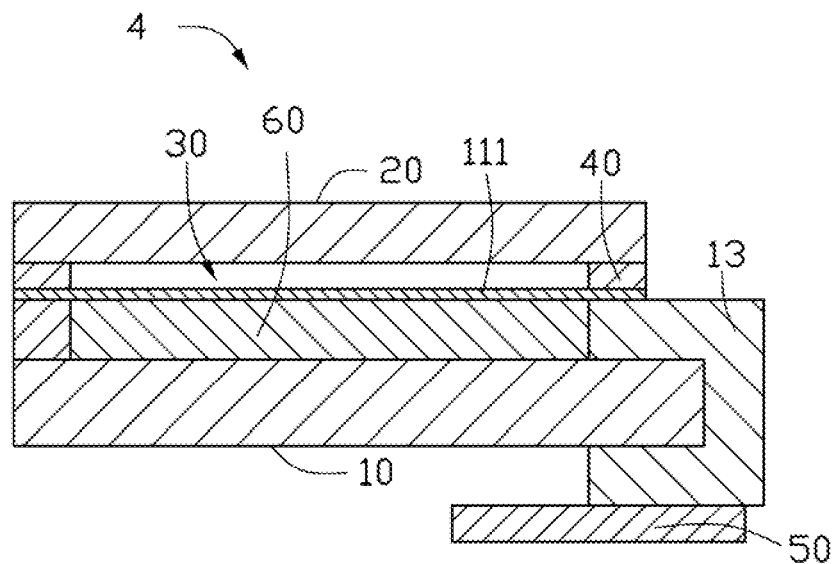
FIG. 5 is a cross-sectional view of an LCD panel according to a fourth embodiment of the present disclosure.

FIG. 5 shows an LCD panel 4 according to a fourth embodiment of the present disclosure. In this embodiment, the sealant 40 may be at least partially located on the film 13. Specifically, the sealant 40 at least partially overlaps a portion of the film 13 that is in direct contact with the first surface 11. In this embodiment, the thickness of the sealant 40 that does not cover the film 13 is greater than the thickness of the sealant 40 that covers the film 13, such that the first substrate 10 and the second substrate 20 may be substantially parallel after being assembled. Since at least a portion of the sealant 40 is located on the film 13, the distance between the first substrate 10 and the second substrate 20 is increased. In order to avoid an increase in the thickness of the liquid crystal layer 30, a planarization layer 60 may be formed on a surface of the first substrate 10 or the second substrate 20 adjacent to the liquid crystal layer 30.

It can be understood that, in other embodiment, both surfaces of the first substrate 10 and the second substrate 20 close to the liquid crystal layer 30 are formed with planarization layers 60. The planarization layer 60 reduces the space between the first substrate 10 and the second substrate 20, therefore the thickness of the liquid crystal layer 30 will not increase.

Figure 6:
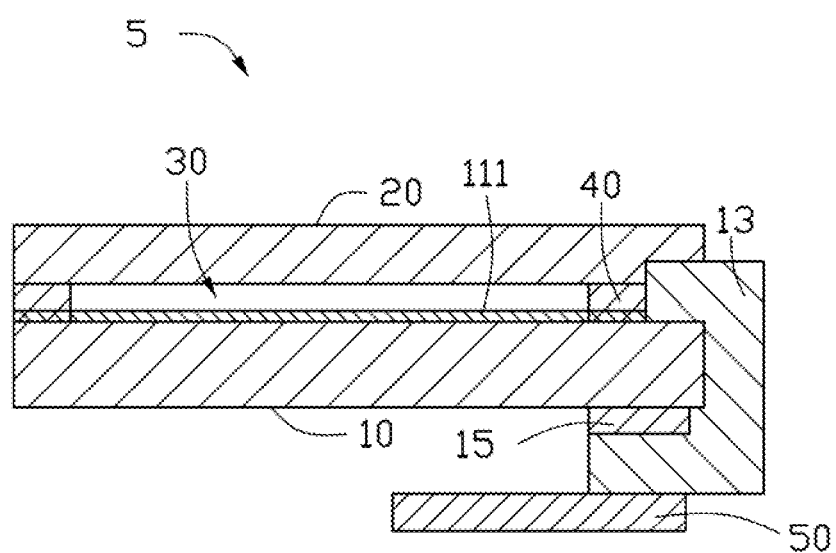
FIG. 6 is a cross-sectional view of an LCD panel according to a fifth embodiment of the present disclosure.

FIG. 6 shows an LCD panel 5 according to a fifth embodiment of the present disclosure. In this embodiment, the LCD panel 5 further comprises a support layer 15 overlapping the projections of the film 13 and the chip in a direction perpendicular to the first substrate 10. The support layer 13 is located on a surface of the film 13 opposite to the chip and is used for supporting the chip 50. A hardness of the support layer 15 is greater than that of the film 13. In this embodiment, the support layer 15 is located between the first substrate 10 and the film 13.

Figure 7:
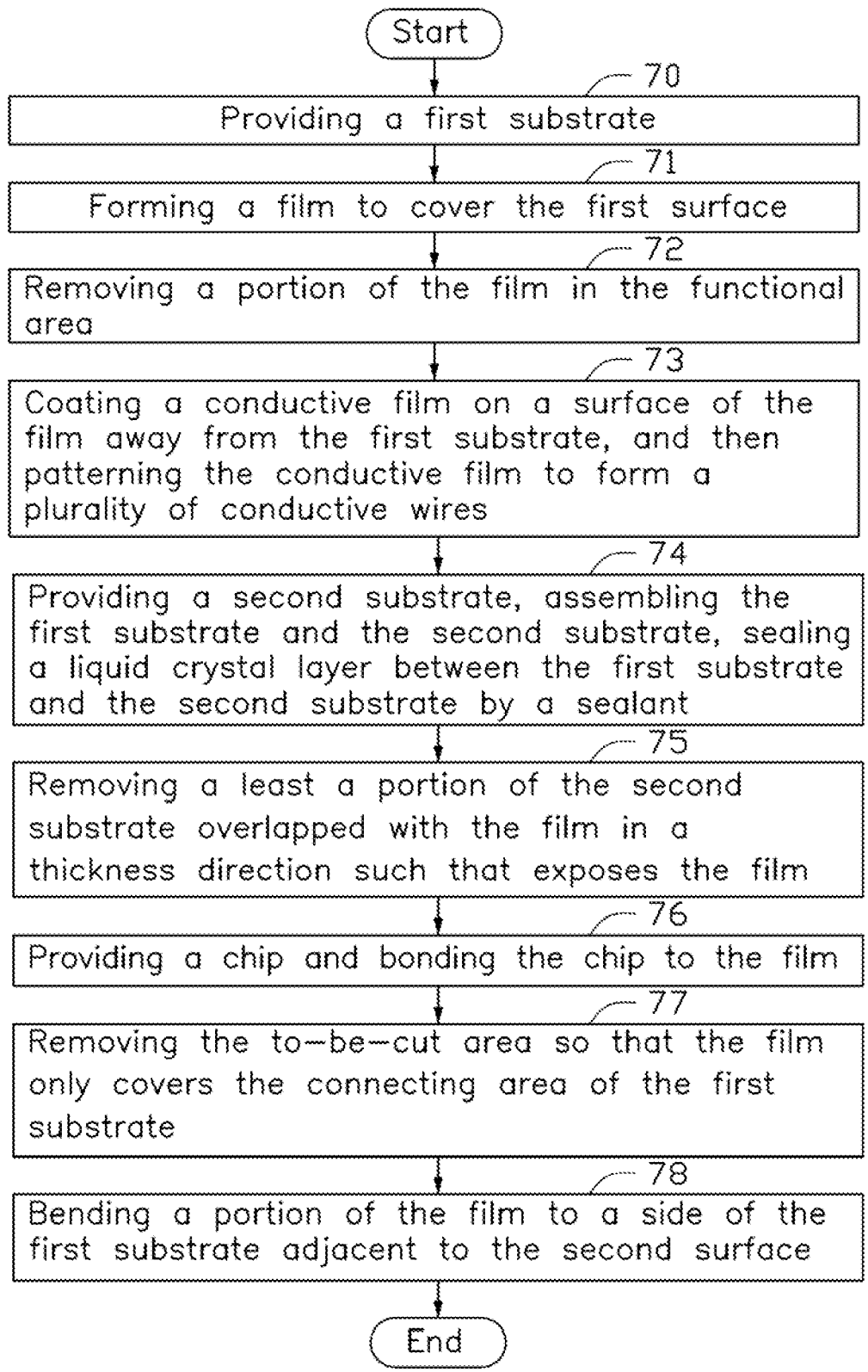
FIG. 7 is a flowchart of a method for manufacturing an LCD panel according to an embodiment of the present disclosure.

Referring to FIG. 7, a method for manufacturing a LCD panel 1 comprises step S70 to step S78.

Figure 8A:
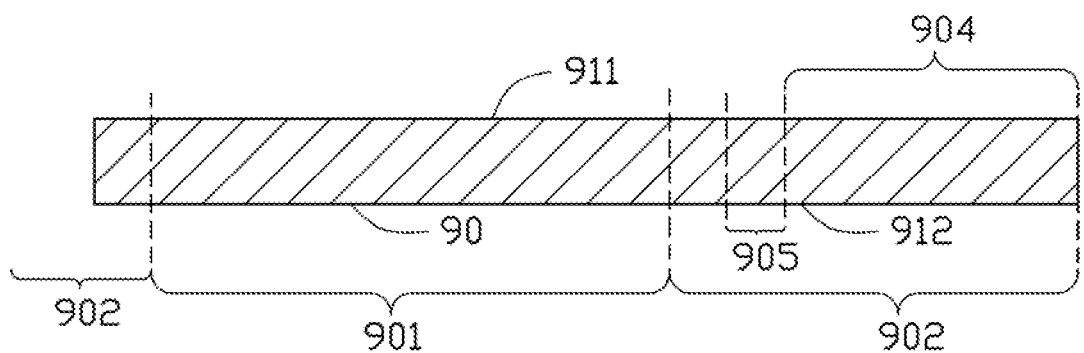
FIG. 8A through FIG. 8H are cross-sectional views showing the method for manufacturing the LCD panel according to the embodiment of the present disclosure.

In step S70, as shown in FIG. 8A, a mother substrate 90 is provided.

The mother substrate 90 comprises a first surface 911 and a second surface 912 away from the first surface 911. The mother substrate 90 defines a functional area 901 and a peripheral area 902 around the functional area 901. The peripheral area 902 further comprises a connecting area 905 and a to-be-cut area 904.

Figure 8B:
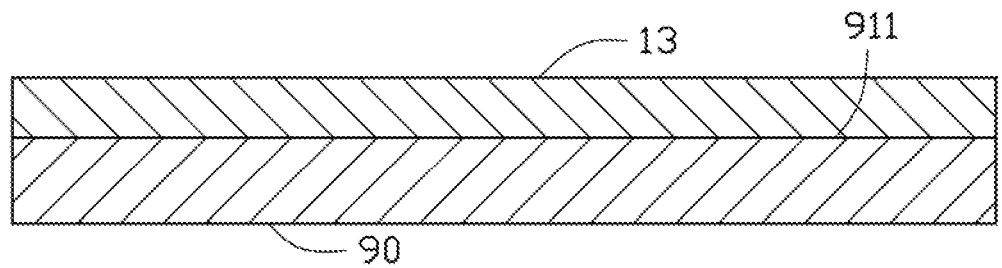

In step S71, as shown in FIG. 8B, a film 13 is formed on the first surface 911 of the mother substrate 90.

The film 13 can be formed on the mother substrate 90 by a silt coater. The film 13 may be a flexible material such as polyimide (PI).

The film 13 has a melting point of more than 205° C.

In this embodiment, the film 13 is formed in a vacuum chamber.

Figure 8C:
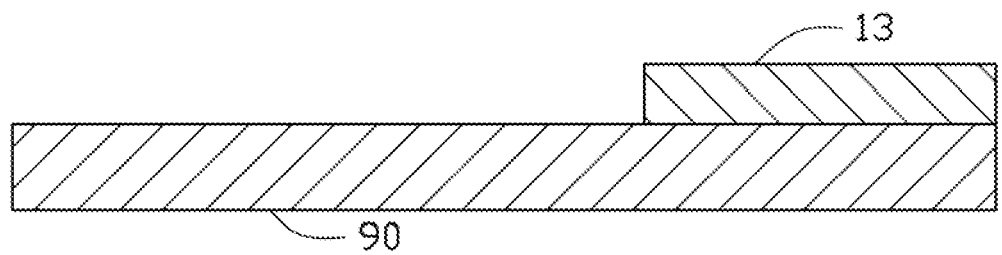

In step S72, as shown in FIG. 8C, a portion of the film 13 located in the functional area 901 is removed.

In step S73, a conductive film (not shown) is formed on a surface of the film 13 away from the mother substrate 90, and the conductive film is patterned to form a plurality of conductive wires 14 on the film 13.

It can be understood that, a functional layer 111 (in this embodiment the functional layer is a TFT driving layer) with a plurality of functional units (not shown) achieving basic functions of the LCD panel 1 can also be formed on the mother substrate 90. The TFT driving layer comprises a plurality of metal layers and a plurality of insulating layers. In this embodiment, the metal layers are located on the first surface 911. The metal layers can be patterned into a plurality of wires, a plurality of gate electrodes, a plurality of source electrodes, and a plurality of drain electrodes (not shown).

The mother substrate 90 further comprises a plurality of in-panel wires connecting to the functional units and providing signal transmission paths between driving signals and the functional units.

In step S74, a second substrate 20 is provided. The mother substrate 90 and the second substrate 20 are assembled; a liquid crystal layer 30 is sealed between the mother substrate 90 and the second substrate 20 by a sealant 40.

Figure 8D:
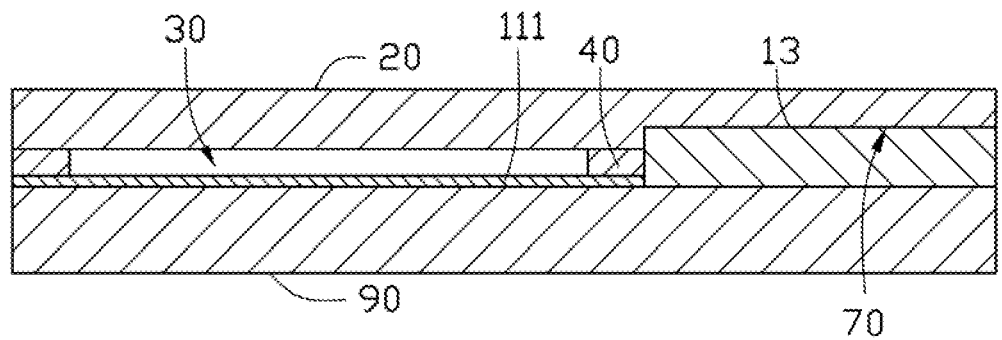

As shown in FIG. 8D, the second substrate 20 is a color filter which comprises filter units. The sealant 40 traces a frame to surround the functional area 101.

In this embodiment, the thickness of the film 13 is greater than a thickness of the liquid crystal layer 30. A recess 70 may be formed on at least one of the mother substrate 90 and the second substrate 20 for accommodating the film 13.

In other embodiment, the sealant 40 may be at least partially located on the film 13. Specifically, the sealant 40 at least partially overlaps a portion of the film 13 that is in direct contact with the first surface 11.

In step S75, a least a portion of the second substrate 20 overlapped with the film 13 in a thickness direction is removed, such that the film 13 is exposed.

Figure 8E:
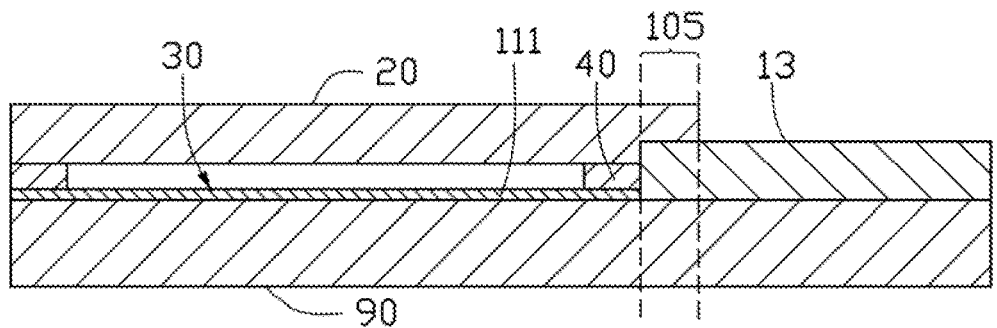
Figure 8F:
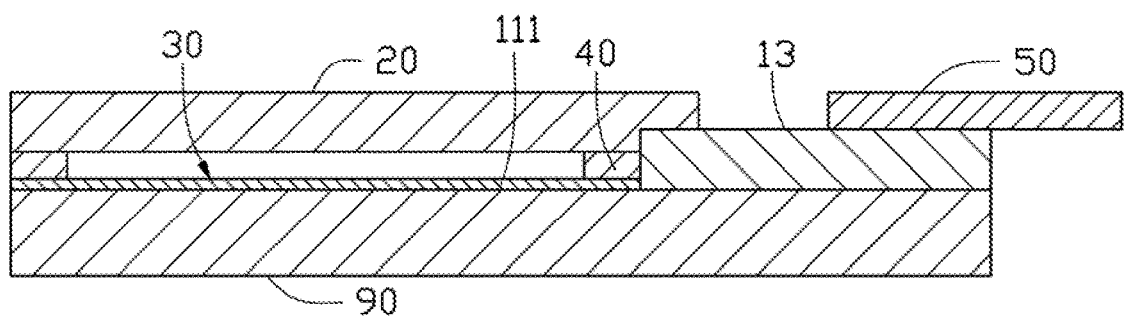

As shown in FIG. 8E, in this embodiment, a portion of the film 13 located at the connecting area 105 is overlapped with the second substrate 20 in the thickness direction. After at least a portion of the second substrate 20 is removed, a portion of the film 13 located outside the connecting area 105 is exposed.

In an embodiment, after at least a portion of the second substrate 20 is removed, a portion of the film located in the connecting area 105 may also be exposed.

In step S76, a chip 50 is provided and bonded to the film 13.

As shown in FIG. 8, the chip 50 is located at an end of the film 13 away from the sealant 40. In this embodiment, the chip 50 extends out of the film 13 directly away from the sealant 40. In this embodiment, the chip 50 may be a gate driver, a source driver, or a time controller.

In step S77, the to-be-cut area 104 is removed, such that the film 13 only covers the connecting area 105 of the mother substrate 90. A part of the film 13 corresponding to the to-be-cut area becomes a free portion, wherein the free portion extends over the mother substrate.

Figure 8G:
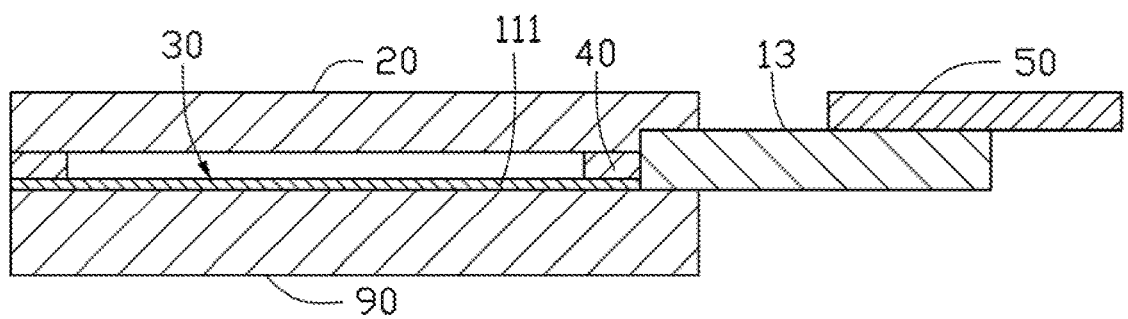
Figure 8H:
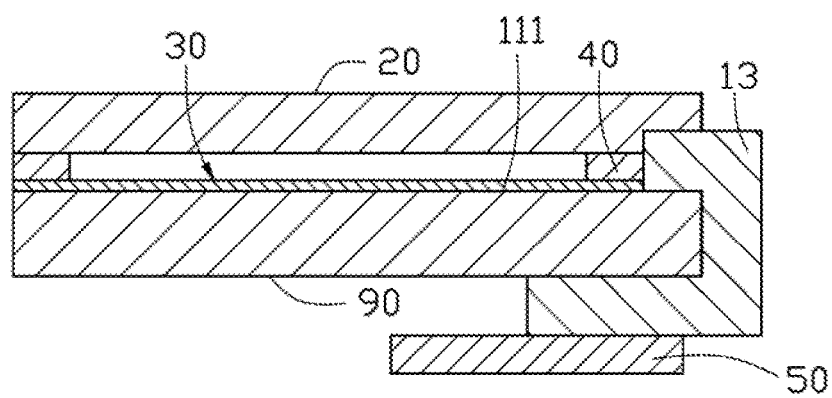

As shown in FIG. 8G the to-be-cut area 104 can be removed by laser cutter or by peeling. In this embodiment, a portion of the mother substrate 90 beyond the second substrate 20 is removed.

In step S78, the free portion of the film 13 that is not overlapped with the mother substrate 90 and the second substrate 20 is bent to a side of the first substrate 10 away from the second substrate 20.

That is, the free portion of the film 13 is wrapped around side surfaces of the mother substrate 90 so the free portion extends over the second surface 912 of the mother substrate 90.

As shown in 8H, in this embodiment, a projection of the chip 50 is overlapped with the projections of the mother substrate 90, the second substrate 20, and the liquid crystal layer 30, allowing a narrow border of the LCD to be realized.

Figure 9:
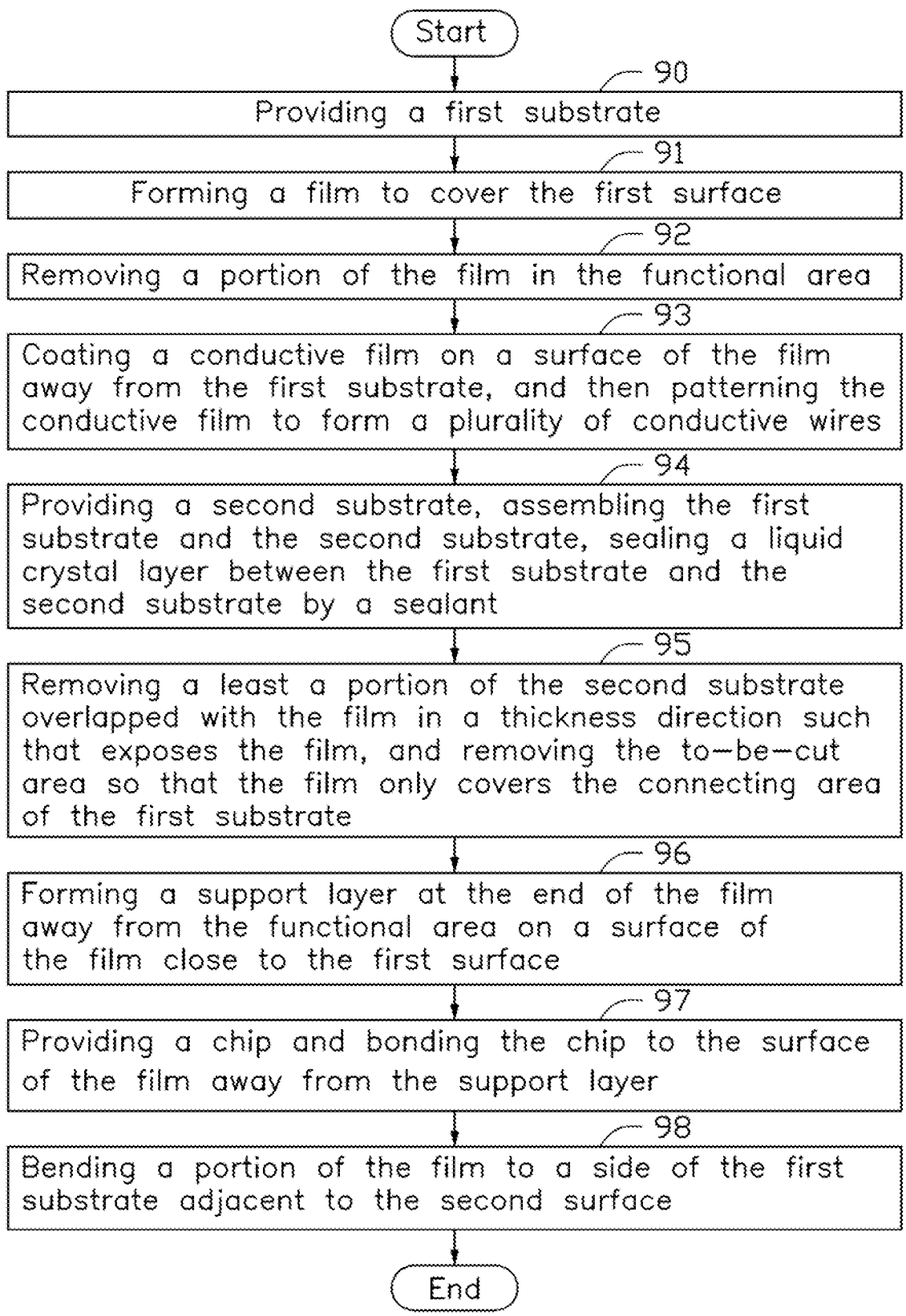
FIG. 9 is a flowchart of a method for manufacturing an LCD panel according to another embodiment of the present disclosure.

As shown in FIG. 9, a method for manufacturing LCD 5 comprises step S90 to step S98. The steps S90 to S94 are similar to steps S70 to S74 mentioned above and will not described again.

In step S95, a least a portion of the second substrate 20 overlapped with the film 13 in a thickness direction is removed, such that the film 13 is exposed. The to-be-cut area 104 is removed so that the film 13 only covers the connecting area 105 of the first substrate 10.

In step S96, at the end of the film away from the functional area 101, a support layer 15 is formed on a surface of the film 13 away from the surface of the film 13 where a chip 50 to be formed.

In step S97, the chip 50 is bonded to the surface of the film 13 away from the support layer 15.

In this embodiment, the support layer 15 is overlapped with the chip 50 in the thickness direction.

In step S98, a portion of the film 13 that is not overlapped with the mother substrate 90 and the second substrate 20 is bent to a side of the mother substrate 90 away from the second substrate 20.

That is, the free portion of the film 13 is wrapped around side surfaces of the mother substrate 90 so the free portion extends over the second surface 912 of the mother substrate 90

After the film 13 is bent, the support layer 15 is located between the first substrate 10 and the film 13.

Applying the above steps, the liquid crystal display panel 5 as shown in FIG. 6 is formed.

Figure 10:
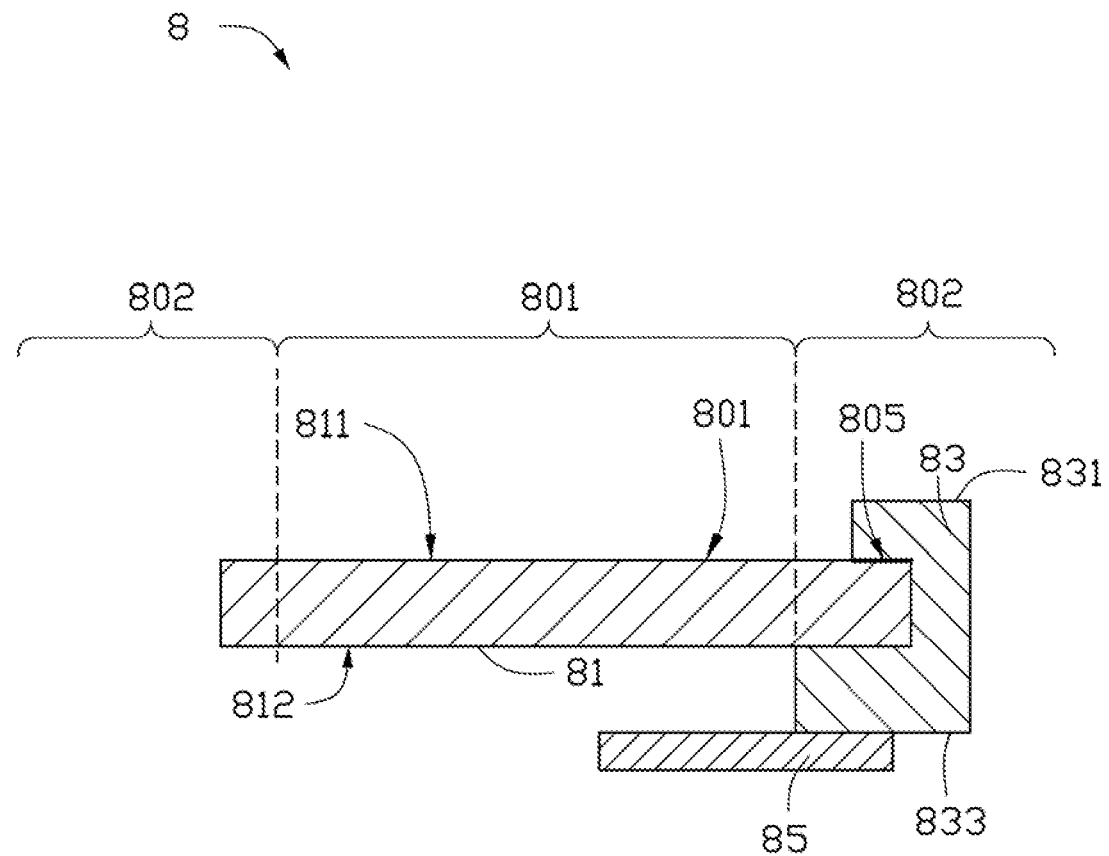
FIG. 10 is a cross-sectional view of a panel according to an embodiment of the present disclosure.

As shown in FIG. 10, the present disclosure further provides a panel 8. The panel 8 may be an organic light emitting diode (OLED) display panel or a touch panel. The panel 8 comprises a first substrate 81. The first substrate 81 defines a functional area 801, a peripheral area 802 located at the periphery of the functional area 801, and a connecting area 805 located within the peripheral area 802. The first substrate 81 comprises a first surface 811 and a second surface 812 opposite to the first surface 811. When the panel 8 is an OLED panel, the functional area 801 is used for display and when the panel 8 is a touch panel, the functional area 801 is used for sensing touch operations.

The panel 8 further comprises a film 83 directly formed on the connecting area 805 of the first surface 811.

As shown in FIG. 10, the film 83 comprises a first end 831 and a second end 833 away from the first end 831. The first end 831 is directly formed on the first surface, that is, the first end 831 of the film 83 is in direct contact with the first surface 811. A chip 85 is located on the second end 833, the second end 833 is extended to a side of the first substrate 81 away from the first surface 811.

In this embodiment, the chip 85 is fixed to the film 83 by COF technology. A plurality of wires (not shown) are formed on the film 83, and the wires are used to electrically couple the chip 85 and the first substrate 81. In this embodiment, the film 83 is bent to the second surface 812 and overlaps at least a portion of the second surface 812.

The film 85 is directly formed on the first substrate 81 without a bonding pad, therefore, bonding pads do not need to be formed on the connecting area 805. A size of the connecting area can thus be reduced, which is advantageous to narrow border design.

The film 83 may be a flexible material such as polyimide (PI). The film 83 may be directly formed on the mother substrate 90 by coating or other suitable methods, there is no need to bond the film 83 by hot pressing through the bonding pads, which allows the film 83 to be thinner. In this embodiment, a thickness of the film 83 is less than or equal to 10 µm.

Figure 11:
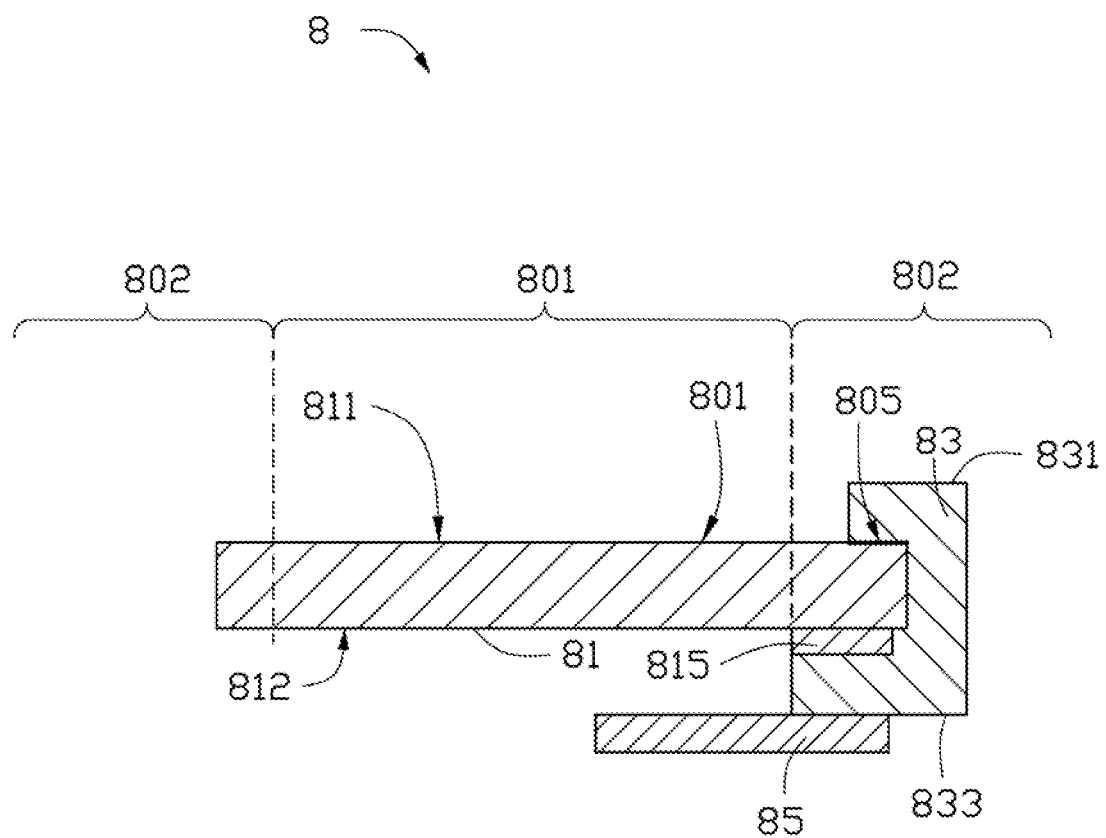
FIG. 11 is a cross-sectional view of a panel according to another embodiment of the present disclosure.

As shown in FIG. 11, in other embodiment, the panel 8 may further comprise a support layer 815 overlapping the projections of the film 83 and the chip 85 in a direction perpendicular to the first substrate 10. The support layer 815 is located on a surface of the film 83 opposite to the chip 85 and is used for supporting the chip 85. A hardness of the support layer 815 is greater than that of the film 83. In this embodiment, the support layer 85 is located between the first substrate 81 and the film 83.

Figure 12:
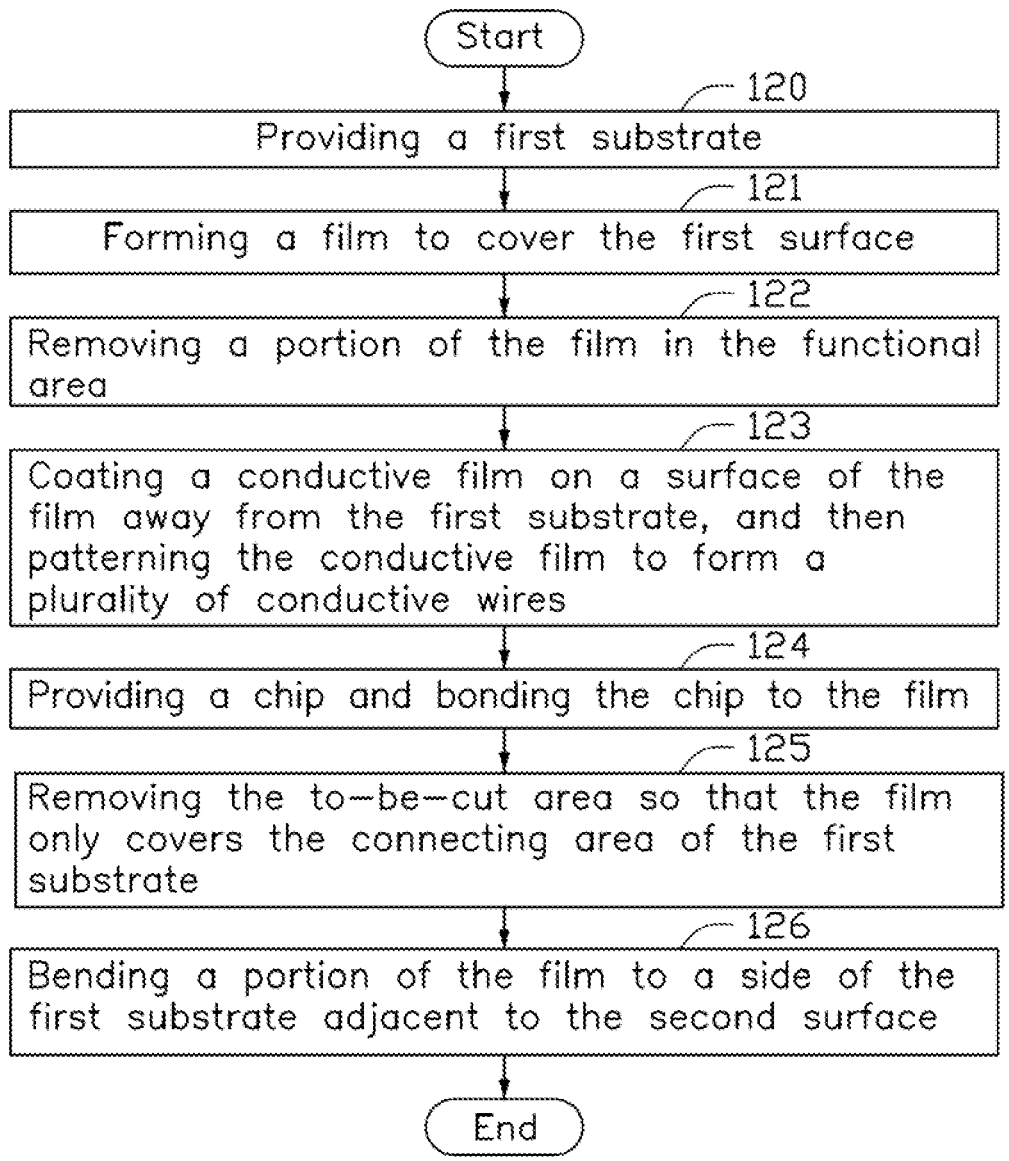
FIG. 12 is a flowchart of a method for manufacturing a panel according to an embodiment of the present disclosure.

As shown in FIG. 12, a method for manufacturing panel 8 comprises step S120 to step S126.

Figure 13A:
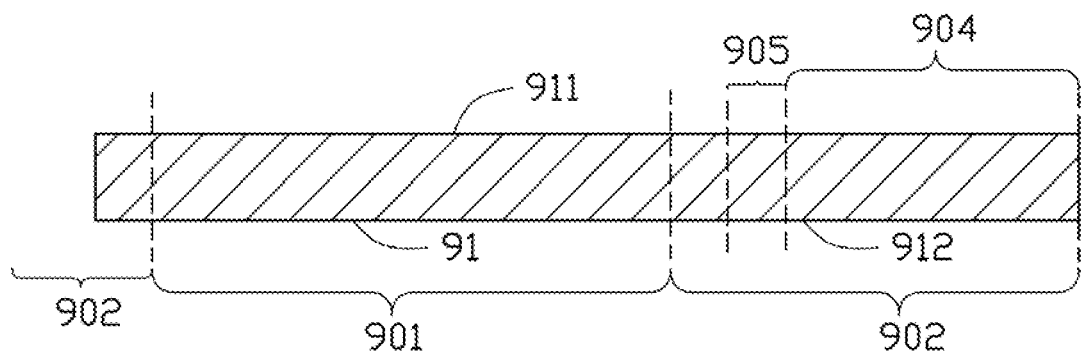
FIG. 13A through FIG. 13F are cross-sectional views showing the method for manufacturing the panel according to the embodiment of the present disclosure.

In step S120, as shown in FIG. 13A, a mother substrate 90 is provided.

The mother substrate 90 comprises a first surface 911 and a second surface 912 away from the first surface 911. The mother substrate 90 defines a functional area 901 and a peripheral area 902 outside the functional area 901. The peripheral area 902 further comprises a connecting area 905 and a to-be-cut area 904.

Figure 13B:
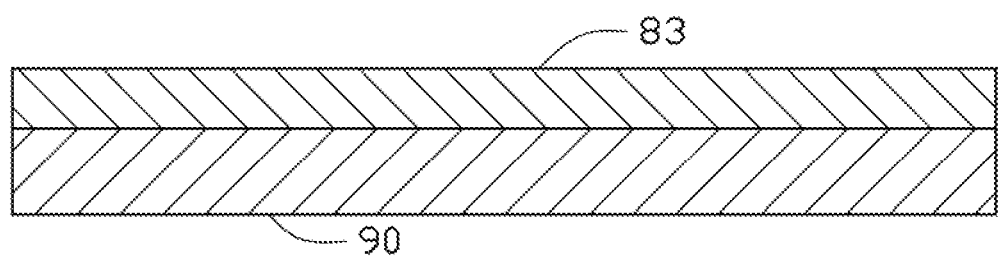

In step S121, as shown in FIG. 13B, a film 83 is formed on the first surface 911 of the mother substrate 90.

The film 83 can be formed on the mother substrate 90 by a silt coater. The film 83 may be a flexible material such as polyimide (PI). The film 83 has a melting point of more than 205° C.

In this embodiment, the film 83 is formed in the connecting area 905 of the mother substrate 90 in a vacuum chamber.

Figure 13C:
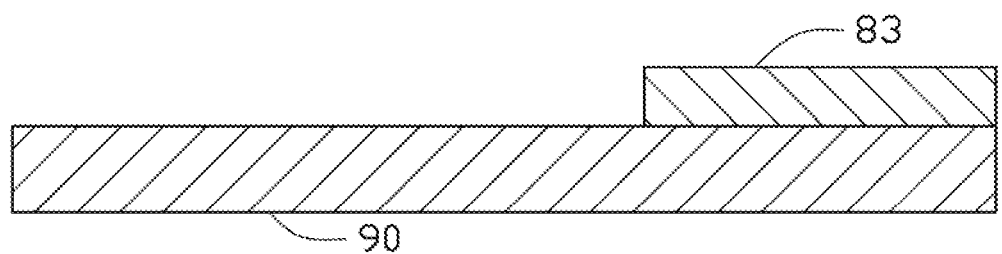

In step S122, as shown in FIG. 13C, a portion of the film 83 located in the functional area 901 is removed.

In step S123, a conductive film (not shown) is formed on a surface of the film 83 away from the mother substrate 90, and the conductive film is patterned to form a plurality of conductive wires on the film 83.

In this embodiment, a functional layer 111 with a plurality of functional units (not shown) achieving basic functions of the electronic panel 8 can also be formed on the mother substrate 90.

The mother substrate 90 further comprises a plurality of in-panel wires (not shown) connecting to the functional units and providing signal transmission paths between driving signals and the functional units.

Figure 13D:
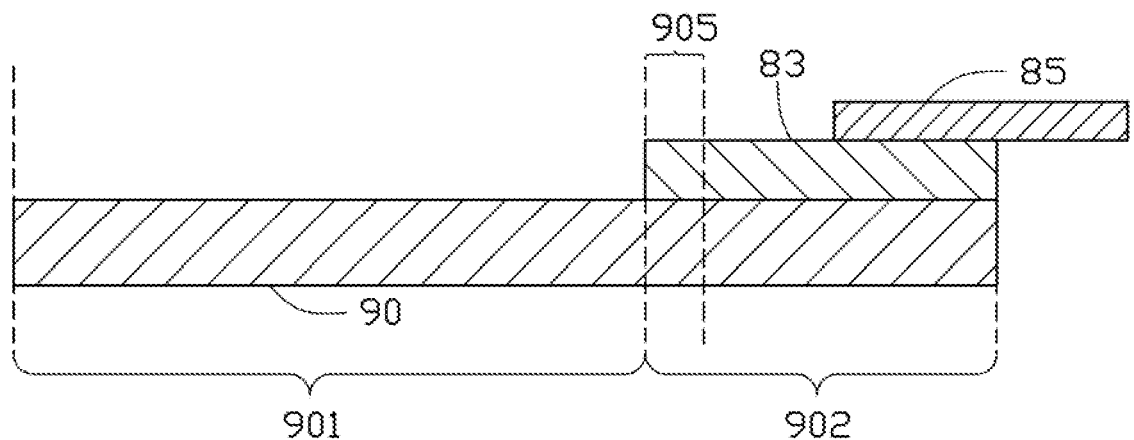

In step S124, as shown in FIG. 13D, a chip 85 is provided and bonded to the film 83.

The chip 50 is located at an end of the film 83 away from the functional area 901. In this embodiment, the chip 50 extends out of the film 83 in a direction away from the functional area 901.

Figure 13E:
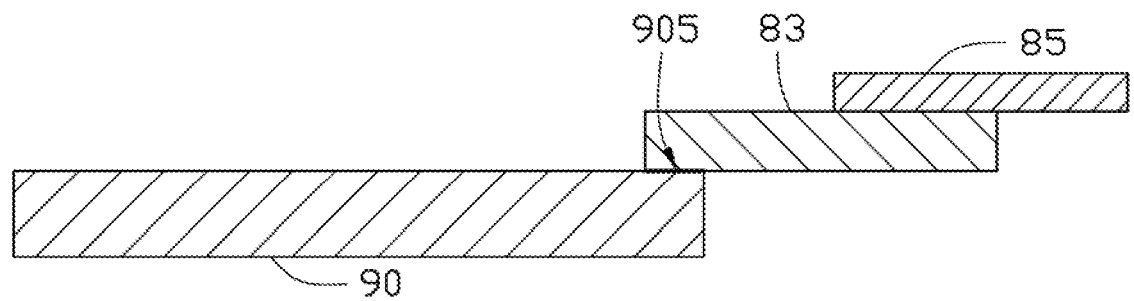

In step S125, as shown in FIG. 13E, the to-be-cut area 804 is removed, such that the film 83 only covers the connecting area 805 of the mother substrate 90. A part of the film 83 corresponding to the to-be-cut area 805 becomes a free portion, wherein the free portion extends over the mother substrate.

In this embodiment, the to-be-cut area 904 of the mother substrate 90 can be removed by laser cutting or by peeling.

Figure 13F:
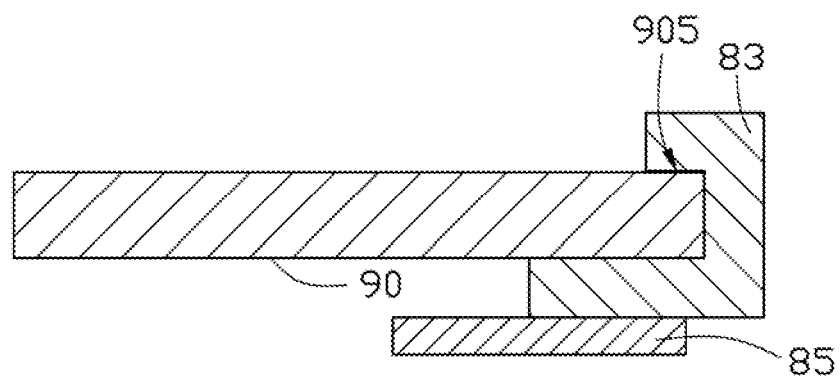

In step S126, as shown in FIG. 13F, the free portion of the film 83 is bent to a side of the mother substrate 90 away from the first surface 811, therefore a narrow border of the LCD may be realized.

That is, the free portion of the film 13 is wrapped around side surfaces of the mother substrate 90 so the free portion extends over the second surface 912 of the mother substrate 90.

Applying the above steps, the panel 8 as shown in FIG. 10 is formed.

Figure 14:
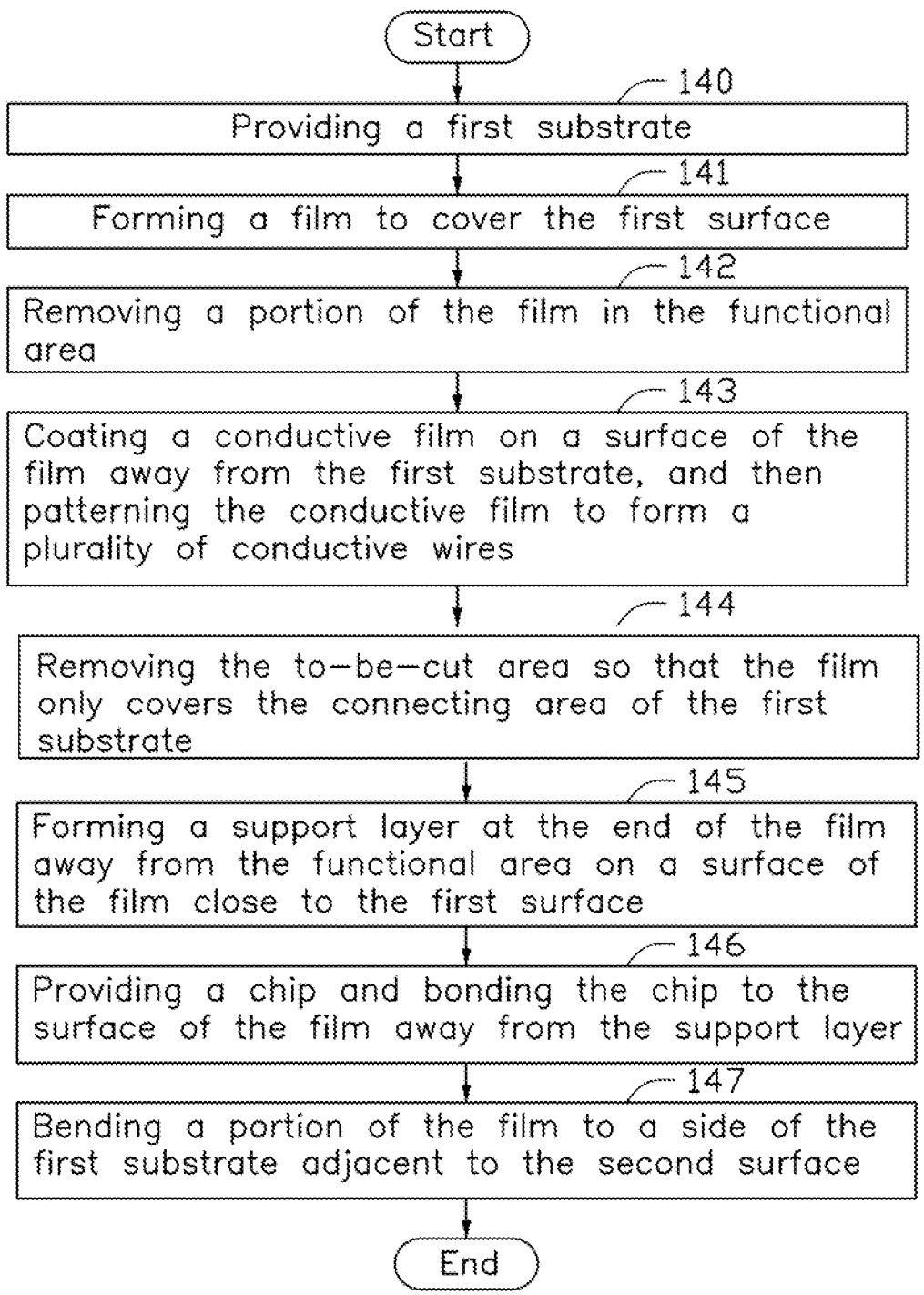
FIG. 14 is a flowchart of a method for manufacturing a panel according to another embodiment of the present disclosure.

As shown in FIG. 14, a method for manufacturing another panel 8 comprises step S140 to step S147, wherein the steps S140 to S143 are similar to steps S120 to S123 mentioned above and will not be repeated.

In step S144, the to-be-cut area 804 is removed, such that the film 83 only covers the connecting area 805 of the first substrate 81. A part of the film 83 corresponding to the to-be-cut area 805 becomes a free portion, wherein the free portion extends over the mother substrate.

In step S145, in the end of the film 83 away from the functional area 101, a support layer 815 is formed on a surface of the film 13 away from the surface of the film 83 where a chip 85 is to be formed.

In step S146, the chip 85 is bonded to the surface of the film 83 away from the support layer 815.

In this embodiment, the support layer 815 is overlapped with the chip 85 in the thickness direction.

In step S147, a portion of the film 83 that is not overlapped with the first substrate 81 is bent to a side of the first substrate 81 away from the first surface 811.

In this embodiment, the free portion of the film 13 is wrapped around side surfaces of the mother substrate 90 so the free portion extends over the second surface 912 of the mother substrate 90.

After the film 83 is bent, the support layer 815 is located between the first substrate 81 and the film 83.

Applying the above steps, the panel 8 as shown in FIG. 11 is formed.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A panel, comprising:
   a first substrate comprising a first surface and a second surface opposite to the first surface, the first substrate defining a functional area and a peripheral area around the functional area;
   a function layer formed on the first substrate in the functional area and comprising a plurality of functional units adapted to performing functions of the panel;
   a plurality of in-panel wires connecting to the functional units and providing signal transmission paths for functional units;
   a chip providing driving signals; and
   a film being flexible, a plurality of conductive wires being on the film, a first end of the film being directly attaches to a part of a first surface in the peripheral area of the first substrate, and a second end of the film being bent to be below a second surface, wherein the second surface is opposite to the first surface;

wherein the chip is formed on the second end, and the in-panel wires are electrically coupled to the chip via the plurality of conductive wires;

wherein the panel further comprises a support layer;

wherein the support layer is located on a surface of the film opposite to the chip, the support layer is between the first substrate and the film, projections of the support layer and the chip on the film are overlapped.

2. The panel of claim 1, wherein the film is made of polyimide.

3. The panel of claim 1, wherein the panel is one of an organic light emitting diode (OLED) display panel and a touch panel, when the panel is the OLED display panel, the functional units are OLED pixels, when the panel is a touch panel, the functional units are touch sensor units.

4. The panel of claim 1, wherein a hardness of the support layer is greater than a hardness of the film.

5. The panel of claim 1, wherein the panel is a liquid crystal display panel;

the liquid crystal display panel further comprises a second substrate, a sealant, and a liquid crystal layer sealed between the first substrate and the second substrate by a sealant.

6. The panel of claim 5, wherein a thickness of the film is greater than a thickness of the sealant; and the second substrate further comprises a recess, and at least a portion of the film is accommodated in the recess.

7. The panel of claim 5, wherein the thickness of the film is greater than a thickness of the sealant; and the first substrate comprises a first recesses, and the second substrate comprises a second recess, at least a portion of the film is accommodated in the first recess and the second recess.

8. The panel of claim 5, wherein at least a portion of the sealant is applied on the film, a planarization layer is formed on a surface of the first substrate or a surface of the second substrate close to the liquid crystal layer.

9. A method for manufacturing panel, comprising:

providing a mother substrate which is larger than the panel, the mother substrate comprising a first surface and a second surface opposite to the first surface;

defining a functional area and a peripheral area on the mother substrate, the peripheral area surrounding the functional area; forming a functional layer on the functional area; placing a plurality of functioning units on the functional area; connecting a plurality of in-panel wires to the functional area to provide signal transmission paths; defining a connecting area and a to-be-cut area on the peripheral area, the connecting area being between the functional area and the to-be-cut area;

forming a flexible film to cover the first surface;

removing a portion of the flexible film located on the first surface in the functional area;

coating a conductive film on a surface of the flexible film away from the mother substrate, and then patterning the conductive film to form a plurality of conductive wires;

removing the to-be-cut area of the mother substrate and making a part of the flexible film corresponding to the to-be-cut area to be a free portion, wherein the free portion extends over the mother substrate;

forming a support layer at an end of the flexible film away from the functional area on a surface of the flexible film close to the first surface, wherein a hardness of the support layer is greater than a hardness of the flexible film; wherein the support layer is between the mother substrate and the flexible film;

bonding a chip to the flexible film formed with the conductive wires and coupling the chip to the in-panel wires via the conductive wires; wherein projections of the chip and the support layer on the flexible film are overlapped;

wrapping the free portion around side surfaces of the mother substrate so the free portion extends over the second surface of the mother substrate.

\* \* \* \* \*